US012573467B2

(12) United States Patent
Yu et al.

(10) Patent No.: US 12,573,467 B2
(45) Date of Patent: Mar. 10, 2026

(54) SENSE AMPLIFIER AND OUTPUT LATCH CIRCUIT FOR TESTING

(71) Applicant: Taiwan Semiconductor Manufacturing Company Ltd., Hsinchu (TW)

(72) Inventors: Hua-Hsin Yu, Hsinchu (TW); Che-An Lee, Hsinchu (TW); Hau-Tai Shieh, Hsinchu (TW); Cheng Hung Lee, Hsinchu (TW); Hung-Jen Liao, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 105 days.

(21) Appl. No.: 18/463,905

(22) Filed: Sep. 8, 2023

(65) Prior Publication Data

US 2025/0087291 A1      Mar. 13, 2025

(51) Int. Cl.
*G11C 29/12* (2006.01)
*G11C 29/46* (2006.01)
*G11C 29/54* (2006.01)

(52) U.S. Cl.
CPC .......... *G11C 29/46* (2013.01); *G11C 29/1201* (2013.01); *G11C 29/12015* (2013.01); *G11C 29/54* (2013.01)

(58) Field of Classification Search
CPC ................ G11C 29/46; G11C 29/1201; G11C 29/12015; G11C 29/54
See application file for complete search history.

(56) References Cited

U.S. PATENT DOCUMENTS

2015/0248923 A1* 9/2015 Lin ........................... G11C 7/08
365/191
2021/0050040 A1* 2/2021 Ramesh .................. H03M 7/24

FOREIGN PATENT DOCUMENTS

CN        102394094 A    11/2013

OTHER PUBLICATIONS

Office Action issued in connection with Taiwan Appl. No. 113111302 dated Dec. 12, 2024.

* cited by examiner

*Primary Examiner* — Mohammed A Bashar
(74) *Attorney, Agent, or Firm* — Foley & Lardner LLP

(57)      ABSTRACT

An input/output circuit comprises a bypass circuit, a first latch, a second latch, a first transistor, and a second transistor. The bypass circuit is configured to directly receive a data signal and indirectly receive a write enable signal. The first latch is coupled between a first data line and a second data line. The second latch is operatively coupled to the first latch and configured to generate a data output signal based on a voltage level presented on the second data line. The first transistor is coupled to the first latch and gated by a sense enable signal. The second transistor is coupled to the first latch and gated by a clock signal. The first transistor and the second transistor are alternately activated in each of a plurality of operation modes of the input/output circuit.

20 Claims, 10 Drawing Sheets

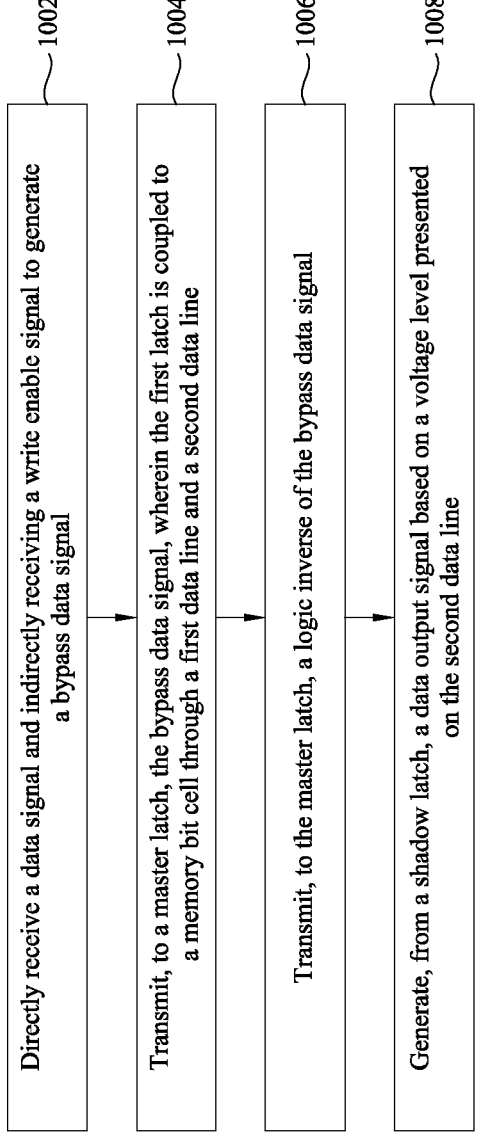

1000

1002 — Directly receive a data signal and indirectly receiving a write enable signal to generate a bypass data signal 1004 — Transmit, to a master latch, the bypass data signal, wherein the first latch is coupled to a memory bit cell through a first data line and a second data line 1006 — Transmit, to the master latch, a logic inverse of the bypass data signal 1008 — Generate, from a shadow latch, a data output signal based on a voltage level presented on the second data line

FIG. 10

SENSE AMPLIFIER AND OUTPUT LATCH CIRCUIT FOR TESTING

BACKGROUND

In a memory circuit designed for testability (DFT), several components are incorporated, including a D-flip-flop circuit, a write-in latch circuit, a read-out sense amplifier, and an output-Q-latch circuit. However, during the DFT test mode, the sense amplifier and the output-Q-latch circuit remain idle, whereas in the write mode, the sense amplifier alone is idle. The DFT memory circuit can further include a write-in and shadow latch circuit, a 3-to-1 multiplexer (MUX), a passive matrix (PM) isolation (ISO) clamping circuit, and a power-saving logic circuit. The presence of these additional features incurs a significant area penalty in memory design, impacting the overall size of the circuit.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 10 is a flowchart of an example method for operating the memory device of FIG. 1, in accordance with some embodiments of the present disclosure.

DETAILED DESCRIPTION

Figure 1:
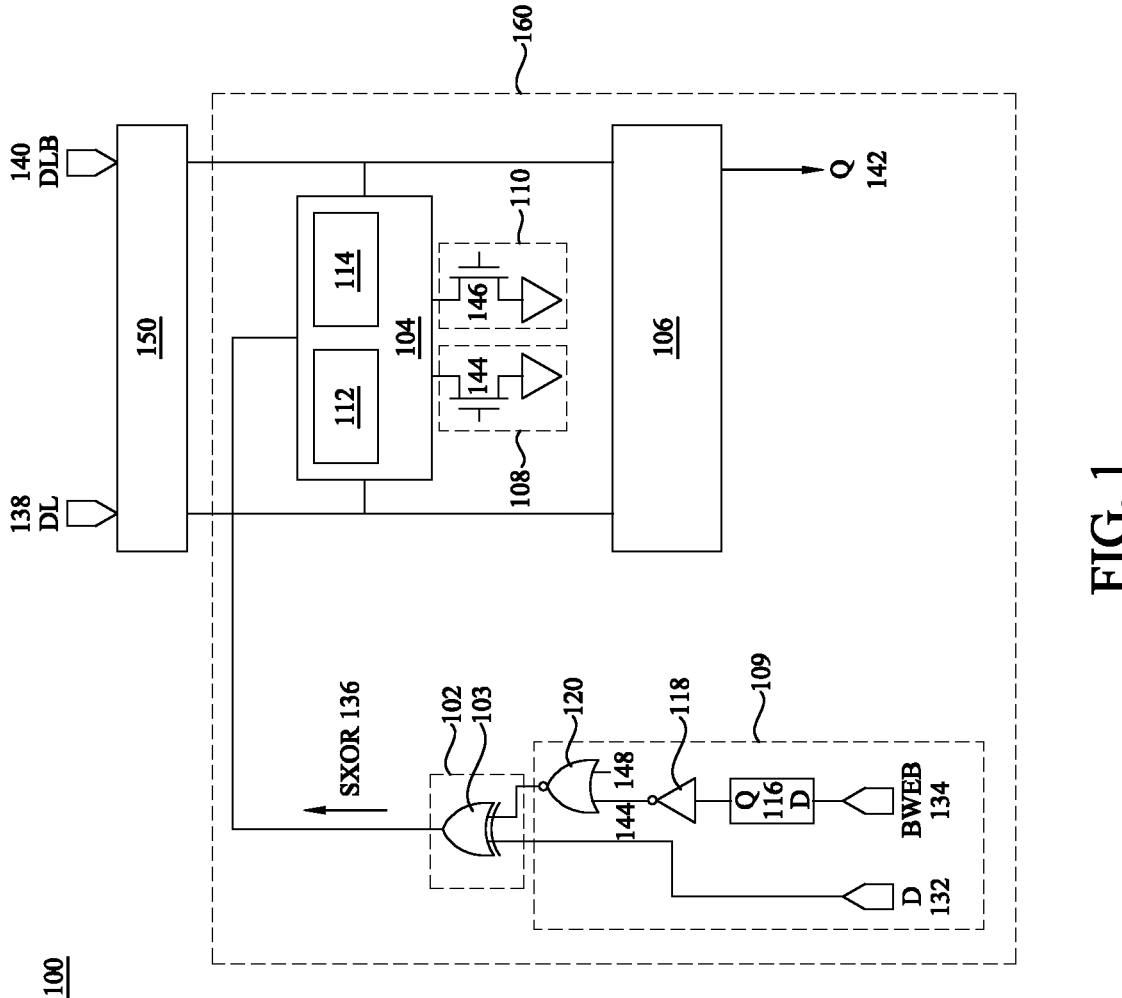
FIG. 1 illustrates a block diagram of a memory device, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A design for testability (DFT) function can be required in a memory design which may comprises at least one of: a latch circuit, a flip-flop circuit, or a combinational logic circuit. In some approaches, test patterns (e.g., binary vectors) are applied as SI inputs to a DFT circuit. The present disclosure provides a memory device with a DFT function by replacing a DFT D-flip-flop circuit and a write-in latch circuit with an existing read-out sense amplifier and a data output latch circuit (e.g., referred to a Q latch). The present disclosure can eliminate the need for write and shadow latches related circuits in every input/output (I/O) circuit, resulting in improved area usage and reduced area overhead. This is achieved by eliminating the need for additional logic circuits such as a write-in latch, a shadow latch, a 3-to-1 multiplexer (MUX), a passive matrix (PM) clamping circuit, and a power-saving logic circuit.

In some embodiments, a sense amplifier may cooperate with data output latch circuit (e.g., referred to a Q latch) for generating the result of the test in the test mode, instead of being idle according to some approaches. Accordingly, additional shadow latch circuit applied for shifting test pattern in the test mode is eliminated from the DFT circuit. Moreover, as described previously, a write-in latch for performing a write operation usually would not operate simultaneously as the write-in latch could be idle during a read operation and the sense amplifier is being pre-charged during a write operation. The disclosure replaces a write-in latch by modifying an existing sense amplifier so as to reduce the area taken up by the original write-in latch. By doing so, the power consumption and leakage current can be reduced, as the replacement does not require any additional power consumption or introduce new leakage current.

FIG. 1 illustrates a block diagram of a memory device 100, in accordance with some embodiments of the present disclosure. The memory device 100 may include an input circuit 109, a bypass circuit 102, a first latch 104, a second latch 106, a first transistor 108, and a second transistor 110. The input circuit 109 may be operatively coupled to the bypass circuit 102. The input circuit 109 may include a D latch circuit 116, an inverter 118, and a NOR gate 120. The memory device 100 can include an input/output circuit 160 and a memory array 150.

The bypass circuit 102 may include an exclusive OR (XOR) gate 103 with two inputs coupled between the output of the input circuit 109 and the first latch 104. The bypass circuit 102 may be configured to directly receive a data signal D 132 and indirectly receive a write enable signal BWEB 134. In some embodiments, the bypass circuit 102 may have one of its inputs configured to receive the write enable signal BWEB 134 at least through the inverter 118 and the NOR gate 120. In some embodiments, BWEB stands for Bit-Write-Enabled-Bar function which performs logical inversion of enabling a bit write signal. The NOR gate 120 may have one of its inputs configured to receive a control signal 148 (e.g., a test enable signal DFTB). When the control signal 148 is at a first logic state (e.g., "1"), the memory device 100 is configured at a non-test mode, and when the control signal 148 is at a second logic state (e.g., "0"), the memory device 100 is configured at a test mode. The NOR gate 120 may have the other one of its inputs configured to receive a write enable signal BWE 144. The D input of the D latch circuit 116 may be configured to receive the write enable signal BWEB 134. In some embodiments, the D latch circuit 116 is a low-pass latch circuit which allows data to pass through when a clock phase is low (e.g., low logic state, "0"). In various embodiments, the D latch circuit 116 is shared among the NORMAL, SHIFT and CAPTURE modes and paths. The exclusive OR (XOR) gate 103 can be configured to generate a bypass data signal SXOR 136 according to the data signal D 132 and the write enable signal BWEB 134. The output of the bypass circuit 102 is coupled to the first latch 104 to transmit a bypass data signal SXOR 136 to a first switch 112 and a second switch 114.

The first latch 104 can be operatively coupled between a first data line 138 (e.g., data line (DL)) and a second data line 140 (e.g., data line bar (DLB)). The first latch 104 may include a first switch 112 and a second switch 114 operatively coupled between the output of the bypass circuit 102 and the second latch 106. The first switch 112 is operatively coupled between the first data line 138 and the output (e.g., SXOR 136) of the bypass circuit 102. The second switch 114 is operatively coupled between the second data line 140 and the output (e.g., SXOR 136) of the bypass circuit 102. In some embodiments, the first latch 104 can be a sense amplifier. The first latch 104 can be a master latch of the data signal D 132. The first latch 104 may replace a write-in latch for the data signal D 132. The first latch 104 can be configured to sense signals from respective the data lines DL 138 and DLB 140 that represent data bits (1 or 0) stored in respective memory cells, and to amplify a small voltage swing to recognizable logic levels so the data can be interpreted properly by logic circuitry coupled to the memory device 100. In some embodiments, the first latch 104 can be coupled to a memory array 150 through the first data line 138 and the second data line 140.

The second latch 106 can be operatively coupled to the first latch 104. The second latch 106 can be configured to generate an output signal Q 142 based on a voltage level presented on the second data line 140. In some embodiments, the second latch 106 is implemented as a high-pass latch circuit that allows data to pass through when a clock phase is high (e.g., high logic state, "1"). The first latch 104 and the second latch 106 collectively operate as a data flip-flop (e.g., D-flip-flop) in at least one of a plurality of operation modes (e.g., a normal mode or a test mode) where a clock signal (e.g., a DCK signal) is disabled and a sense enable signal (e.g., a SAE signal) toggles as a clock source for the data flip-flop.

The first transistor 108 can be coupled to the first latch 104 and gated by a sense enable signal SAE 144. The second transistor 110 can be coupled to the first latch 104 and gated by a clock signal DCK 146. The first transistor 108 and the second transistor 110 can be alternately activated in each of a plurality of operation modes (e.g., a normal mode or a test mode) of the memory device 100 (e.g., input/output circuit).

In some embodiments, the memory device 100 has different modes of operation, including a NORMAL mode (e.g., read and write mode) and a DFT test mode (e.g., a SHIFT mode, and a CAPTURE mode), while the SHIFT mode includes two sub-modes referred to as SCAN and DEBUG.

In the NORMAL mode (e.g., a read mode or a write mode), the memory device 100 does not perform any testing; instead, the memory device 100 performs its regular functionality that it is designed to perform, such as enabling reading and writing of data from/to a memory, e.g., a static random access memory (SRAM). In some embodiments, a NORMAL path proceeds through the input portion, the memory core logic portion and then the output portion. Specifically, for example, the NORMAL path proceeds through the bypass circuit 102, the first latch 104, and the second latch 106 in the write mode or the read mode. For example, in a non-DFT test mode, the DFTB signal 148 may be set at "1", which allows the bypass circuit 102 to pass the directly received data signal D 132 through the XOR gate 103 and to output the bypass data signal SXOR 136 (the data signal D 132) to the first latch 104. When the memory device 100 is at a read mode, the second transistor 110, the first switch 112, and the second switch 114 are deactivated, and the first transistor 108 is activated. When the memory device 100 is at a write mode, the first transistor 108 is deactivated, and the second transistor 110, the first switch 112, and the second switch 114 are activated.

In the DFT test mode, test-related features are invoked, and various testing functionality is performed on the memory device 100 by applying certain input data (e.g., a data signal D 132 and a write enabled signal BWEB 134) to the memory device 100. For example, in the DFT test mode, the DFTB signal 148 may be set at "0", which allows the bypass circuit 102 to generate an XOR output 136 according to the directly received data signal D 132 and the indirectly received write enable signal BWEB 134. The memory device 100 may compare an output data (e.g., an output signal Q 142 in FIG. 1) with "designed" output data that the memory device 100 is designed to produce. If the observed output matches the "designed" output then the memory device 100 passes the test; if the observed output does not match the "designed" output, the memory device 100 fails the test. When the memory device 100 is at a test mode, the first transistor 108, the first switch 112, and the second switch 114 are activated, and the second transistor 110 is deactivated.

In SHIFT mode and CAPTURE mode, which can be considered as test modes, tests are performed on different parts of the memory device 100. In the CAPTURE mode of the DFT test mode, the data signal D 132 is outputted to a first input of the bypass circuit 102 directly; and the write enable signal BWEB 134 is outputted to a second input of the bypass circuit 102 through the D latch circuit 116, the inverter 118 and the NOR gate 120. The data of the data signal D 132 can be further latched in the first latch 104 and the second latch 106, and read out as the output signal Q 142. In some embodiments, the write enable signal BWEB 134 can be programmed for performing testing. In the SHIFT mode of the DFT test mode, the data signal D 132 is outputted to a first input of the bypass circuit 102 directly; and the write enable signal BWEB 134 is outputted to a second input of the bypass circuit 102 through the D latch circuit 116, the inverter 118 and the NOR gate 120. The first latch 104 may provide a data signal corresponding to the data signal D 132 to the second latch 106 for temporary storage of test data. In some embodiments, a CAPTURE path and a SHIFT path both pass through the input portion and proceed through the memory core logic portion, and then to the output portion. Specifically, for example, both of the CAPTURE path and the SHIFT path proceed through the first latch 104 and the second latch 106 in the memory core logic portion. The details of configurations and operations will be discussed in the following paragraphs.

In some embodiments, a system includes multiple memory devices 100 that sequentially coupled with each other, in which a first memory device 100 receives a data signal (referred to as a data signal inputted as the data signal D of FIG. 1) from external test device and a read out data (e.g., a signal generated by an inverter 212 in FIG. 2) from the first memory device 100 is transmitted as a data signal (inputted as the data signal D 132 of FIG. 1) to a following memory device 100, and so on.

The configurations of FIG. 1 are given for illustrative purposes. Various implements are within the contemplated scope of the present disclosure. For example, in some embodiments, the D latch circuit 116 is not included in the input circuit 102.

Figure 2:
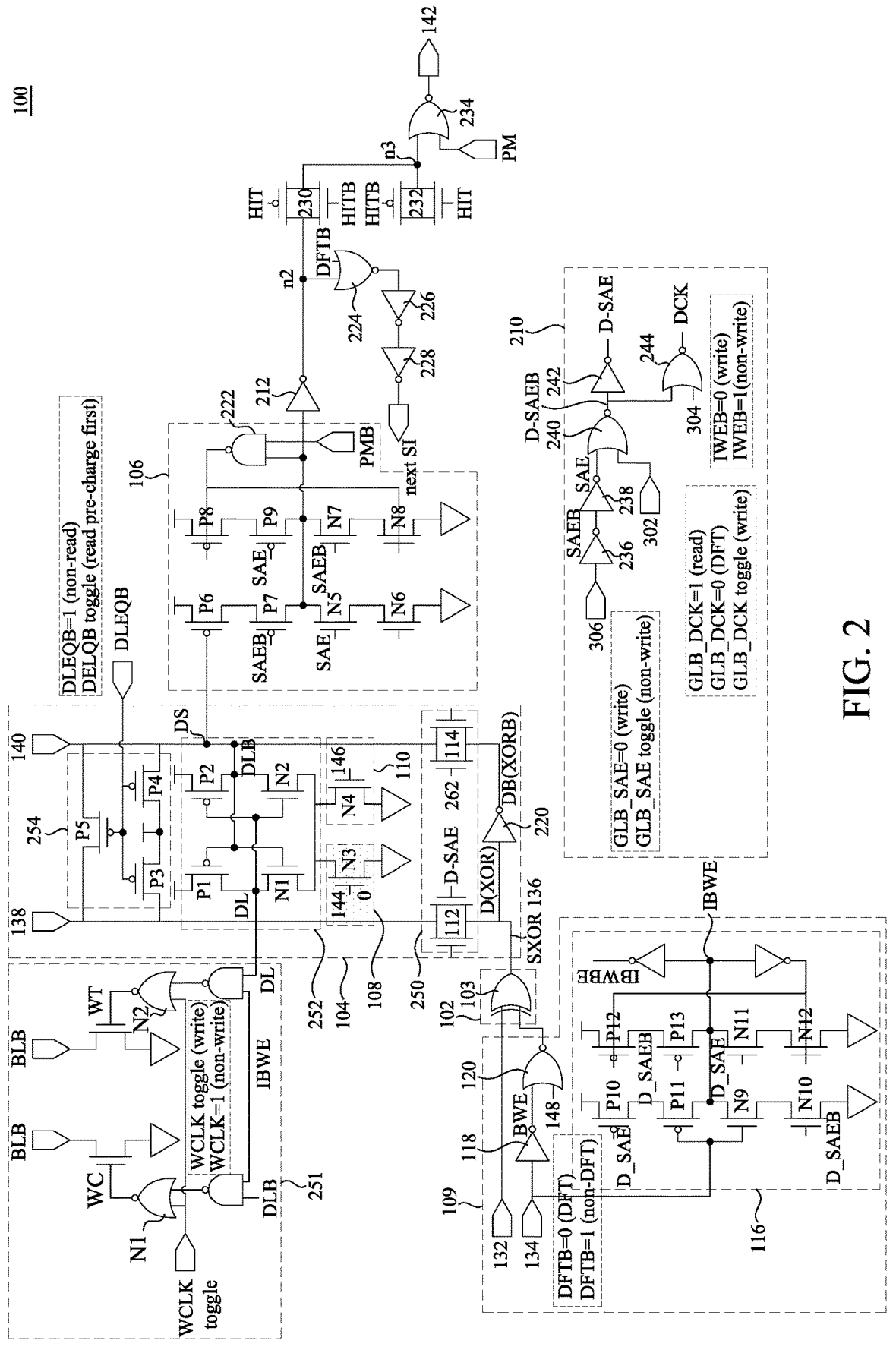
FIG. 2 illustrates a detailed schematic diagram of the memory device of FIG. 1, in accordance with some embodiments of the present disclosure.

FIG. 2 illustrates a detailed schematic diagram of the memory device 100 of FIG. 1, in accordance with some embodiments of the present disclosure. The memory device 100 may include an input circuit 109, a bypass circuit 102, a first latch 104, a second latch 106, a first transistor 108, and a second transistor 110. The input circuit 109 can be configured to transmit signals corresponding to the data signal D 132 and the write enable signal BWEB 134 to the bypass circuit 102. The data signal D 132 is directly transmitted to the bypass circuit 102. The write enable signal BWEB 134 can be transmitted to the bypass circuit 102 at least through the inverter 118 and the NOR gate 120. The bypass circuit 102 may include the exclusive OR (XOR) gate 103 configured to generate the bypass data signal SXOR 136 (e.g., signal D or signal XOR) according to the data signal D and the write enable signal BWEB.

The additional logic circuit, such as the inclusion of an inverter 118 and a NOR gate 120, within the input circuit 109 can be utilized to eliminate the need for a data-in latch and a shadow latch related circuits. The NOR gate 120 may have one of its inputs configured to receive a test enable signal DFTB 148. Due to the additional logic circuit, two test modes (e.g., non-DFT test mode and DFT test mode) can be defined. In the non-DFT test mode, the first latch 104 can function as a write-in latch. In the DFT test mode, the first latch 104 and the second latch 106 collectively operate as a data flip-flop (e.g., D-flip-flop).

At a non-DFT test mode, the test enable signal DFTB 148 can be at "1", which can make the NOR gate 120 output "0". The XOR gate 103 may receive the data signal D 132 and the output "0" of the NOR gate 120. In such case, the XOR gate 103 may generate the bypass data signal SXOR 136 (the data signal D 132), and may transmit the bypass data signal SXOR 136 (the data signal D 132) to the first latch 104. An inverter 118 of the first latch 104 may generate an inverted bypass data signal 262 according to the bypass data signal SXOR 136 (the data signal D 132). The first latch 104 may utilize the data signal D 132 and the inverted bypass data signal 262 as inputs to operate as a write-in latch. In the non-DFT test mode, the first latch 104 can function as a write-in latch. In some embodiments, the first latch 104 can be a sense amplifier.

At a DFT test mode, the test enable signal DFTB 148 can be at "0", which can make the NOR gate 120 output the BWEB signal 134. The XOR gate 103 may receive the data signal D 132 and the BWEB signal 134. In such case, the XOR gate 103 may generate the bypass data signal SXOR 136 (a data signal XOR) according to the data signal D 132 and the BWEB signal 134. The XOR gate 103 may transmit the bypass data signal SXOR 136 (a data signal XOR) to the first latch 104. The inverter 118 of the first latch 104 may generate an inverted bypass data signal XORB 262 according to the bypass data signal SXOR 136 (the data signal XOR). The first latch 104 may utilize the bypass data signal SXOR 136 (the data signal XOR) and the inverted bypass data signal XORB 262 as inputs to operate as a DFT D-flip-flop. In the DFT test mode, the first latch 104 and the second latch 106 collectively operate as a data flip-flop (e.g., D-flip-flop) where a clock signal (e.g., the DCK signal 146) is disabled and a sense enable signal (e.g., the SAE signal 144) toggles as a clock source for the data flip-flop.

The D input of the D latch circuit 116 may be configured to receive the write enable signal BWEB 134. In some embodiments, the D latch circuit 116 is a low-pass latch circuit which allows data to pass through when a clock (e.g., the BWEB signal 134) phase is low (e.g., low logic state, "0"). A low-pass latch circuit can be triggered by a momentary low signal on the input, which allows low-frequency or slowly changing signals to pass through while blocking high-frequency signals. In some embodiments, the D latch circuit 116 can be a BWEB input latch, which changes a state of a latch according to the input BWEB signal 134. The D latch circuit 116 can be controlled by the BWEB signal 134.

In some embodiments, the first latch 104 may include a read gating circuit 250, a latch circuit 252, a precharge circuit 254, and an inverter 220 having a terminal coupled to the bypass circuit 102. The read gating circuit 250 can transmit a bypass data signal SXOR 136 and an inverted bypass data signal 262 to the data line DL 138 and the data line DLB 140, respectively, in response to enable signals D-SAE and D-SAEB. For illustration, the read gating circuit 250 is coupled between the data lines DL 138 and DLB 140, the bypass circuit 102, and the inverter 220 of the first latch 104. The read gating circuit 250 may include a first switch 112 and a second switch 114. The first switch 112 may include a transmission gate that is coupled to the data line DL 138, a terminal of the inverter 220, and the output of the exclusive OR gate 103 in the bypass circuit 102 and configured to transmit the bypass data signal SXOR 136 from the exclusive OR gate 103 to the data line DL 138 in response to enable signals D-SAE and D-SAEB. The second switch 114 may include a transmission gate that is coupled to the data line DLD 140, another terminal of the inverter 220. The second switch 114 can be configured to transmit an inverted bypass data signal 262 (e.g., DB or XORB signals) from the inverter 220 to the data line DLB 140 in response to the enable signals D-SAE and D-SAEB. Each of the switches 112-114 (e.g., transmission gates) may comprise one P-type transistor and one N-type transistor, as shown in FIG. 2.

The latch circuit 252 may have terminals coupled to the data lines DL 138 and DLB 140. The latch circuit 252 may transfer the input states from the data lines DL 138 and DLB 140 to the output states when signaled (e.g., a read mode or a DFT test mode), the output thereafter remaining insensitive to changes in input status until signaled again. Alternatively stated, the first switch 112 is coupled between the bypass circuit 102 and one of the terminals of the latch circuit 252, and the second switch 114 is coupled between the inverter 220 and another terminal of the latch circuit 252. For illustration, the latch circuit 252 may include P-type transistors P1-P2 coupled to a voltage terminal (e.g., providing supply voltage VDDM and labeled VDDM hereinafter) and N-type transistor N1-N2 coupled to a first transistor 108 and a second transistor 110. The first transistor 108 and the second transistor 110 can be N-type transistors N3-N4. The first transistor 108 can be coupled to a supply voltage VSS (e.g., providing ground potential and labeled VSS hereinafter) and configured to operate in response to an enable signal SAE 144 which is referred to as a periodic signal for enabling the first latch 104 (e.g., sense amplifier) for a certain mode (e.g., a read mode or a DFT test mode). The first transistor 108 can be gated by a sense enable signal (SAE) 144. The second transistor 110 can be coupled to a supply voltage VSS (e.g., providing ground potential) and configured to operate in response to a clock signal 146 which is referred to as a periodic signal for enabling the first latch 104 (e.g., sense amplifier) for a certain mode (e.g., a write mode). The second transistor 110 can be gated by a clock signal (DCK) 146. The transistors N1 and P1 form an inverter that is cross-coupled with an inverter formed by the transistors N2 and P2.

The precharge circuit 254 is coupled to the data lines DL 138 and DLB 140. In some embodiments, during the test mode, the precharge circuit 254 is configured to be turned off in response to a precharge enable signal DLEQB having a high logic state when the enable signal SAE has the low logic state. In some embodiments, the precharge circuit 254 may include P-type transistors P3-P5 having control terminal receiving the precharge enable signal DLEQB. Specifically, the transistor P3 is coupled between the data line DL 138 and the voltage terminal VDDM, and the transistor P4 is coupled between the data line DLB 140 and the voltage terminal VDDM. The transistor P5 is coupled between the data lines DL 138 and DLB 140.

The second latch 106 (e.g., output latch circuit) may include P-type transistors P6-P9, N-type transistors N5-N8, and a NAND gate 222. The second latch 106 may transfer the output states from the latch circuit 252 to the inverter 212 when signaled (e.g., a read mode or a DFT test mode), the second latch 106 may retain the output state even after removing the input (e.g., the output states from the latch circuit 252). In the embodiments of FIG. 2, the second latch 106 may further includes the inverter 212. In some embodiments, the transistor P6 is coupled between a voltage terminal VDDM and the transistor P7. The transistor P7 is coupled to the transistors N5, N7, P9, an input terminal of the inverter 212, and a first input terminal of the NAND gate 222 at a node n1. The transistor N6 is coupled between the voltage terminal VSS and the transistor N5. The transistor P8 is coupled between the voltage terminal VDDM and the transistor P9. The transistor N8 is coupled between the voltage terminal VSS and the transistor N7. The transistors N6 and P8 have control terminals coupled to the data line DLB 140 and are configured to operate in response to a data signal DS generated by the first latch 104. The transistors P7 and N7 are configured to be switched in response to the enable signal SAEB. The transistors P9 and N5 are configured to be switched in response to the enable signal SAE, while the control terminal of the transistor N5 is coupled to the control terminal of the transistor N3. Control terminals of the transistors P8 and N8 are coupled to the output of the NAND gate 222. The NAND gate 222 may receive an enable control signal PMB (having different logic state than the enable control signal PM). In some embodiments, the memory device 100 further includes a write control circuit 251 that are coupled to the latch circuit 252 in order to operate under different operation modes.

The write control circuit 251 may comprise capture data from a temporary storage source (e.g., the latch circuit 252 or the second latch 106) through the complementary DLB and DL inputs. The latch circuit 252 may provide signals through the complementary DLB and DL inputs. These signals may control the transistor columns, influencing BL and BLB voltages, which are converted to binary signals for write control circuit 251. In this configuration, the write-in latch holds the DL data during a clock cycle for writing into memory cells. During a read operation (e.g., WCLK=1 (non-write mode)), the write-in latch is largely inactive. The write control circuit 251 may a first NOR gate N1, a second NOR gate N2, a write truth (WT) transistor, and write complement (WC) transistor. The first NOR gate N1 may take a write clock (WCLK) and a DLB input, generating the WC driving signal through a NOR operation. The second NOR gate N2 may also use WCLK but pairs it with DL input, producing the WT driving signal. These signals activate the WC and WT transistors, respectively, writing to BL and BLB, which are complementary signals. This configuration facilitates writing operations based on inputs, enabling data storage in corresponding locations.

The memory device 100 further includes a clock generator 210 including inverters 236, 238, and 242, and NOR gates 240 and 244. The NOR gate 240 is coupled between the inverter 238 and the inverter 242 (or the NOR gate 244). Specifically, the inverter 236 is configured to invert a signal GLB_SAE 306 to generate the enable signal SAEB. The inverter 238 is configured to invert the enable signal SAEB to generate the enable signal SAE. The NOR gate 240 is configured to generate the enable signal D-SAEB based on the enable signal SAE and a signal GLB_DCK 302. In some embodiments, the signal GLB_DCK 302 has the low logic state ("0") during the test mode and has the high logic state ("1") in other operational mode (e.g., read mode). The inverter 242 is configured to generate the enable signal D-SAEB based on the enable signal D-SAE. In the test mode, the enable signal D-SAEB is referred to as a delayed signal with respect to the enable signal SAEB, and the enable signal D-SAE is referred to as a delayed signal with respect to the enable signal SAE. In some embodiments, the NOR gate 240 is configured to generate the enable signal D-SAEB based on the enable signal SAE and the signal GLB_DCK 302. The NOR gate 244 is configured to generate a clock signal DCK based on the enable signal D-SAEB and a signal IWEB 304. The clock generator 210 can be an electronic circuit that produces a regular and repeating electrical signal known as a clock signal (e.g., D-SAE signal, DCK signal). The signal can be used to synchronize the operations of digital component in various devices (e.g., the latch circuit 252 or the second latch 106). The clock generator 210 ensures that different parts of a system work together in a coordinated manner.

The memory device 100 may further include a NOR gate 224 and inverters 226, 228. The NOR gate 224 may have a first input coupled to the second latch 106 at a node n2 and a second input receiving the test enable signal DFTB. In some embodiments, the latch circuit 252 and the second latch 106 (e.g., output latch circuit) are referred to as a read path D-flip-flop. Accordingly, for a scan-based testing during the SHIFT mode of the test mode, a data output signal generated by the second latch 106 is transmitted through the NOR gate 224 and the inverters 226, 228 as an input signal (e.g., the data signal D 132) in the following memory device 100.

The memory device 100 may further include transmission gates 230, 232 configured to operate in response to control signals HIT and HITB that have different logic states. In some embodiments, the transmission gate 230 is coupled to the second latch 106 at the node n2 and coupled to an output driver circuit, including a NOR gate 234, at a node n3. The NOR gate 234 has a first input receiving the signal from the transmission gate 230 and a second input receiving an enable control signal PM, and is configured to generate the output signal Q 142.

The configurations of FIG. 2 are given for illustrative purposes. Various implements are within the contemplated scope of the present disclosure. The operations of the circuit 100 of FIG. 2 is substantially similar to the operations of the circuit 100 of FIG. 1. The detailed operational configurations of the memory device 100 in FIGS. 1-2 will be described in the following paragraphs with reference to FIGS. 3-7. FIG. 5 illustrates waveforms of signals in the memory device 100 in FIGS. 1-4, in accordance with some embodiments of the present disclosure. FIG. 7 illustrates waveforms of signals in the memory device 100 in FIGS. 1-2, and 6, in accordance with some embodiments of the present disclosure.

Figure 3:
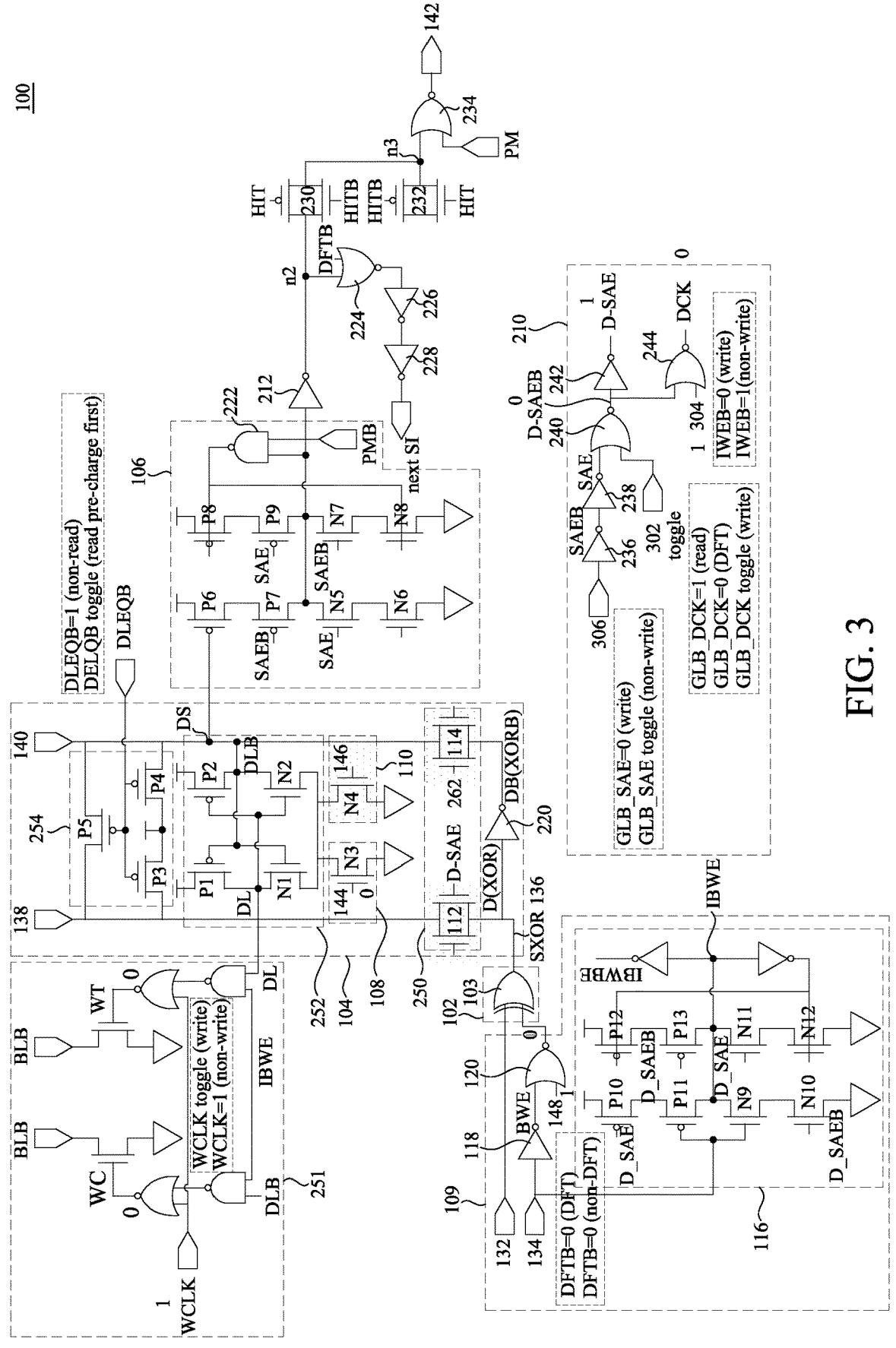
FIG. 3 illustrates a detailed schematic diagram of the memory device of FIG. 1 in a read mode, in accordance with some embodiments of the present disclosure.

FIG. 3 illustrates a detailed schematic diagram of the memory device 100 of FIGS. 1 and 2 in a read mode, in accordance with some embodiments of the present disclosure. At a read mode, the test enable signal DFTB 148 can be set at "1", which can make the NOR gate 120 output "0". The XOR gate 103 may receive the data signal D 132 and the output "0" of the NOR gate 120. In such case, the XOR gate 103 may generate the bypass data signal SXOR 136 (the data signal D 132), and may transmit the bypass data signal SXOR 136 (the data signal D 132) to the first latch 104. When the memory device 100 is at a read mode, the second transistor 110 (e.g., sense amplifier pull-down transistor N4), the first switch 112, and the second switch 114 are deactivated, and the first transistor 108 is activated.

In the read mode, the signal GLB_DCK 302, the signal IWEB 304, the test enable signal DFTB 148 are set to a high logic state ("1"), while the signal GLB_SAE 306 may toggle, simulating a normal read operation. In the read mode, the first latch 104, acting as a sense amplifier, is triggered at the exact timing as in a normal read operation. The D latch circuit 116 (BWEB latch) can be latched during the read operation. The data line pairs (the first data line 138 and the second data line 140) are pre-charged first in response to the precharge enable signal DLEQB. Specifically, the BL is developed, followed by the later activation of a read-column-select to propagate the data to the first data line 138 (e.g., data line DL).

Figure 4:
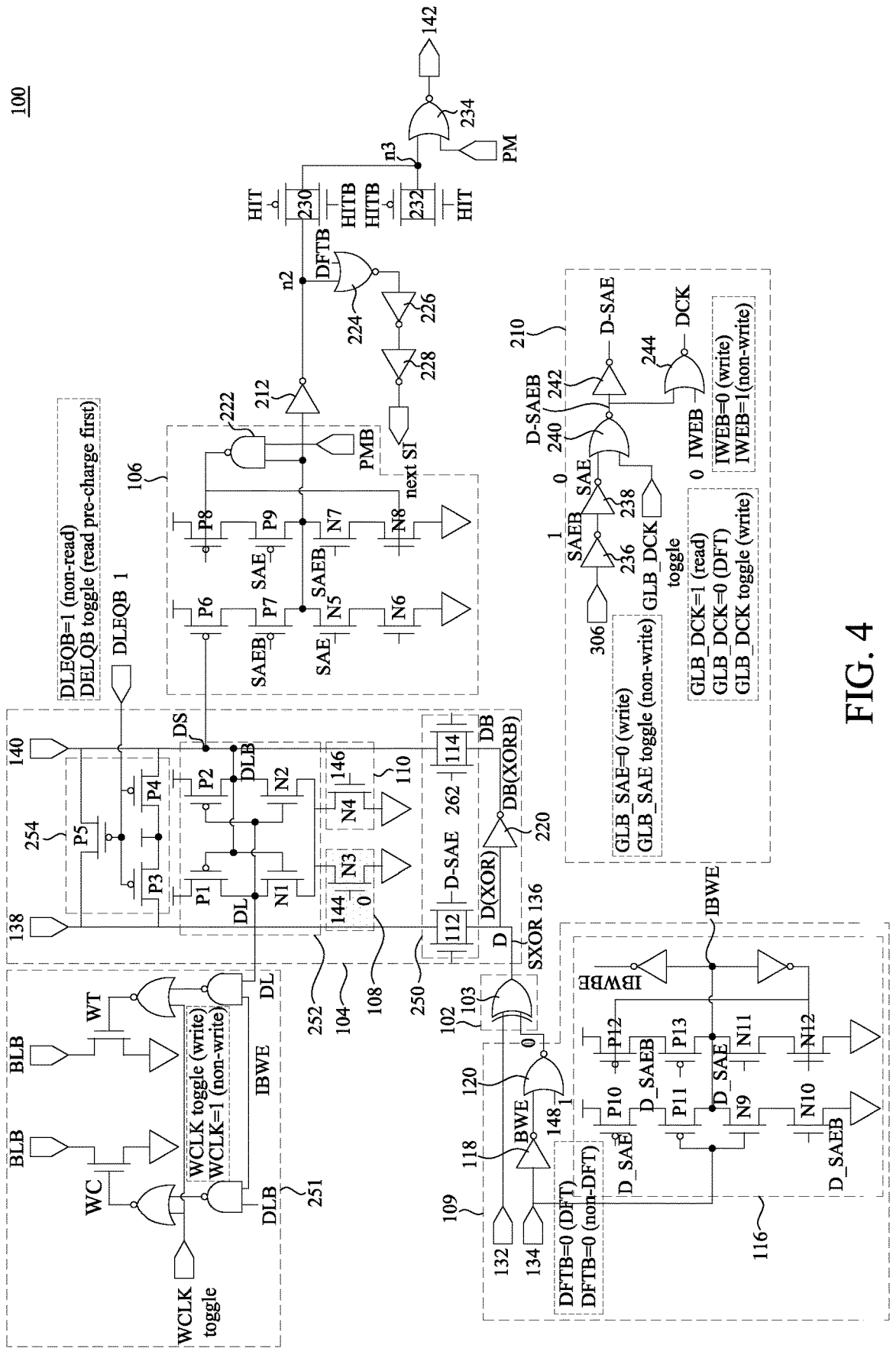
FIG. 4 illustrates a detailed schematic diagram of the memory device of FIG. 1 in a write mode, in accordance with some embodiments of the present disclosure.
Figure 5:
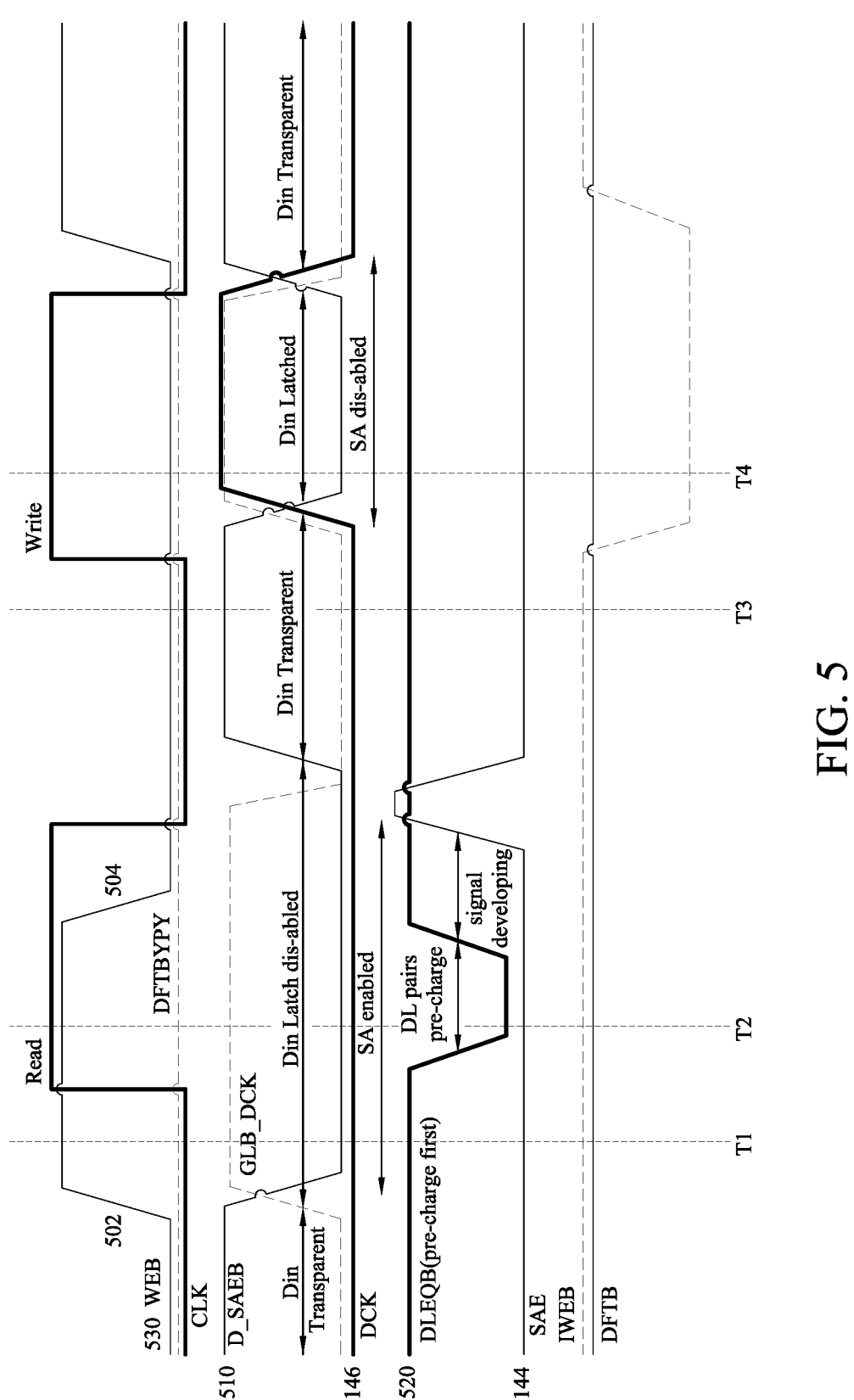
FIG. 5 illustrates waveforms of signals in the memory device in FIGS. 3 and 4, in accordance with some embodiments of the present disclosure.

FIG. 4 illustrates a detailed schematic diagram of the memory device 100 of FIGS. 1 and 2 in a write mode, in accordance with some embodiments of the present disclosure. At a write mode, the test enable signal DFTB 148 can be set at "1", which can make the NOR gate 120 output "0". The XOR gate 103 may receive the data signal D 132 and the output "0" of the NOR gate 120. In such case, the XOR gate 103 may generate the bypass data signal SXOR 136 (the data signal D 132), and may transmit the bypass data signal SXOR 136 (the data signal D 132) to the first latch 104. When the memory device 100 is at a write mode, the first transistor 108 is deactivated, and the second transistor 110, the first switch 112, and the second switch 114 are activated. The first switch 112 and the second switch 114, each gated by the D-SAE signal and/or the D-SAEB signal, may propagate the data signal D and data signal bar DB into the first latch (sense amplifier) 104.

In the write mode, the signal GLB_SAE 306 and the signal IWEB 304 are set to a low logic state ("0"), while the test enable signal DFTB 148 is set to a high logic state ("1"). The signal GLB_DCK 302 may toggle, simulating a normal write operation. In the write mode, the sense enable signal SAE 144 is set to 0 and the enable signal SAEB is set to 1, the second latch 106 (e.g., Q-latch) may retain/latch the read-out data from the previous read cycle, ensuring its preservation. The precharge circuit 254 (e.g., DL pre-chargers) is turned off in response to the precharge enable signal DLEQB set as "1". The first latch 104 (sense amplifier) may function as a data-in latch during a write operation.

The output (IBWE) of the D latch circuit 116 (e.g., BWEB latch) and the DL 138/DLB 140 together may form a write circuit, which is gated by a WCLK signal to control the writing of data to the BL pairs of the write control circuit 251.

FIG. 5 illustrates waveforms of signals in the memory device 100 in FIGS. 3 and 4, in accordance with some embodiments of the present disclosure. The principle of operation of the memory circuit 100 can be explained by using a timing diagram as shown in FIG. 5. In general, a cycle may include a read operation to be followed by a write operation, and the transistors of the latch circuit 252 (e.g. P1, P2, N1, N3) are first pre-charged before every read operation.

At time T1, the precharge circuit 254 may precharge the data lines DL 138 and DLB 140 in response to a precharge enable signal DLEQB 520 having a high logic state when the enable signal SAE 144 has the low logic state. After a period of pre-charge, the signals (e.g., SAE signal 144 or DCK signal 146) may turn on the transistors 144, 146 later since the transistors 108, 110 may take time to recharge.

The D-SAEB 510 is set low during the phase where the Din latch is disabled. The voltage level of a write enable signal (WEB) 530 during a rising clock edge 502 triggers the start of a read operation or a write operation. In the example of FIG. 5, at a first rising clock edge 502, the WEB signal 530 is set high to trigger a read operation during which transistors of the first latch 104 (sense amplifier circuit) is enabled.

At time T2, the DLEQB signal 520 is then set low after the pre-charge has finished. During a read operation, the DCK 146 and the D-SAEB 510 may remain low. The SAE signal 144 may momentarily go high to activate a sensing function of the first latch 104 (sense amplifier circuit). After the sensing function has been performed, the SAE signal 144 may go low and remain low during the write operation. The DCK signal 146 is low throughout the read operation, and the SAE signal 144 is also set low at the beginning of a read cycle. The voltage level of a write enable signal (WEB) 530 during a rising clock edge 502 triggers the start of a read operation. At the end of the read operation, the SAE signal 144 is then momentarily set high to perform sensing of the differential signals (e.g. DL, DLB) so as to sense the binary value. As the SAE signal 144 goes down to low voltage, the D-SAEB signal 510 is set high while the Din is at a transparent phase. After the read operation is finished, the write operation may begin. At a second rising clock edge 504, the WEB signal 530 is set low to trigger a write operation during which the transistors of the first latch 104 (sense amplifier circuit) are disable throughout.

At time T3, before a data is latched during a write operation, the Din signal may go through a period during which the Din is considered transparent and the D-SAEB 510 is set high. In further detail, the DLEQB signal 520 is first set high in order to turn on the voltage precharge circuit 254 (e.g. P3, P4, P5) to equalize and pre-charge the first latch 104 (sense amplifier circuit). The D-SAEB 510 is set high during the phase where the Din is transparent. From the end of a read operation to the start of a write operation, the DLEQB signal 520 may go up to high voltage in order to turn on the voltage precharge circuit 254 and pre-charge the first latch 104 (sense amplifier circuit) throughout the write operation. The DLEQB signal 520 remains high until the beginning of the next cycle, and the SAE signal 144 also remains low throughout the write operation since the first latch 104 (sense amplifier circuit) may not be needed during the write operation except to latch the data received via Din and DinB. In order to latch the data received from Din and DinB, the DCK signal 146 may momentarily set high to perform sensing of the differential signals (e.g. DL, DLB) so as to sense the binary value and also to latch the binary value stored in the latch circuit 252.

At time T4, while the Din signal is latched, the DCK signal 146 is set high. At the start of the write operation, the D-SAEB signal 510 is set high while the Din is at a transparent phase. While the data received from Din and DinB are being latched, the D-SAEB signal 510 may go low as the relationship between D-SAEB 510 and DCK 146 are complementary during a write operation. After the write operation is finished, another cycle of a read operation to be followed by a write operation may begin.

Figure 6:
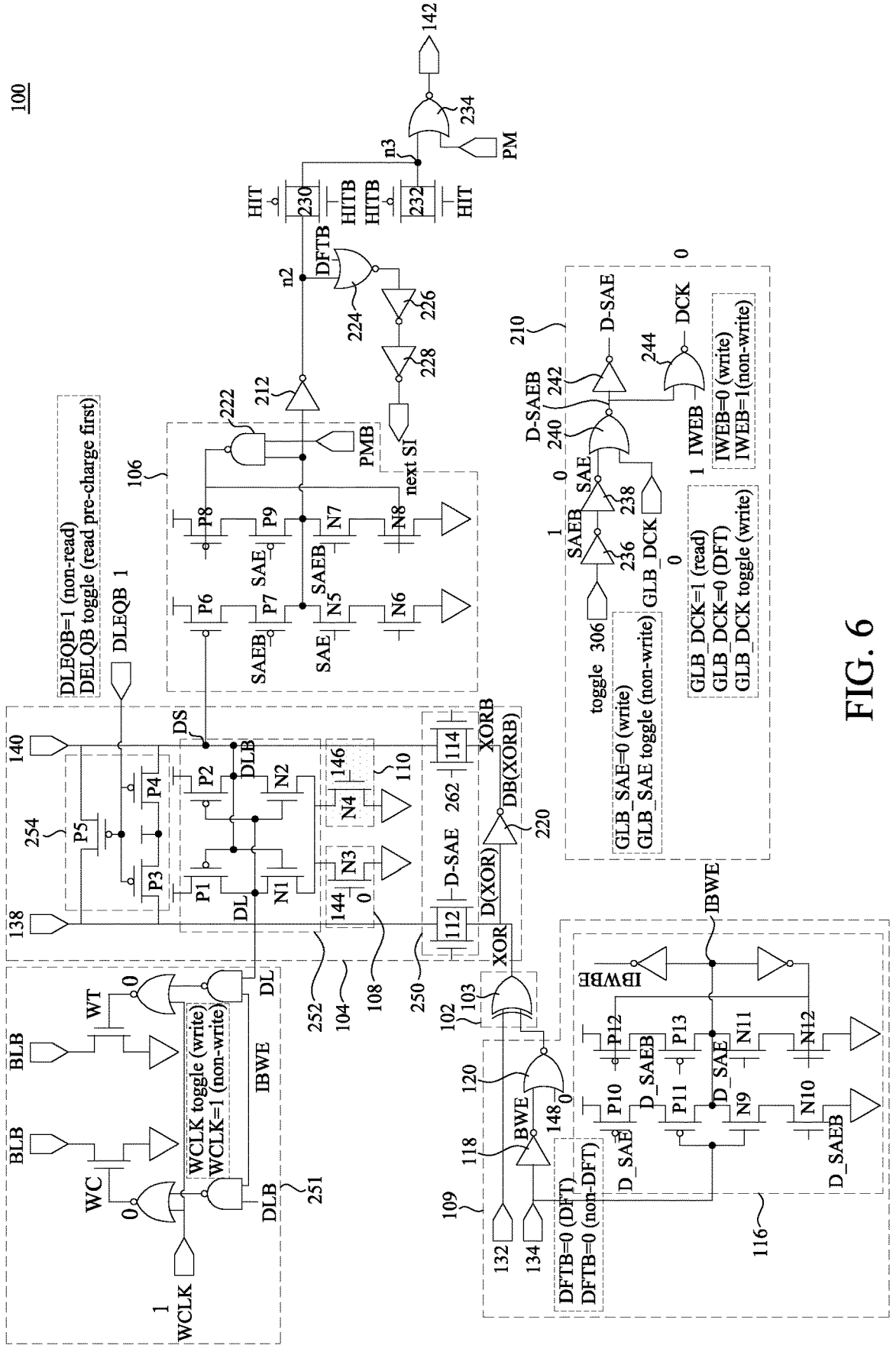
FIG. 6 illustrates a detailed schematic diagram of the memory device of FIG. 1 in a test mode, in accordance with some embodiments of the present disclosure.
Figure 7:
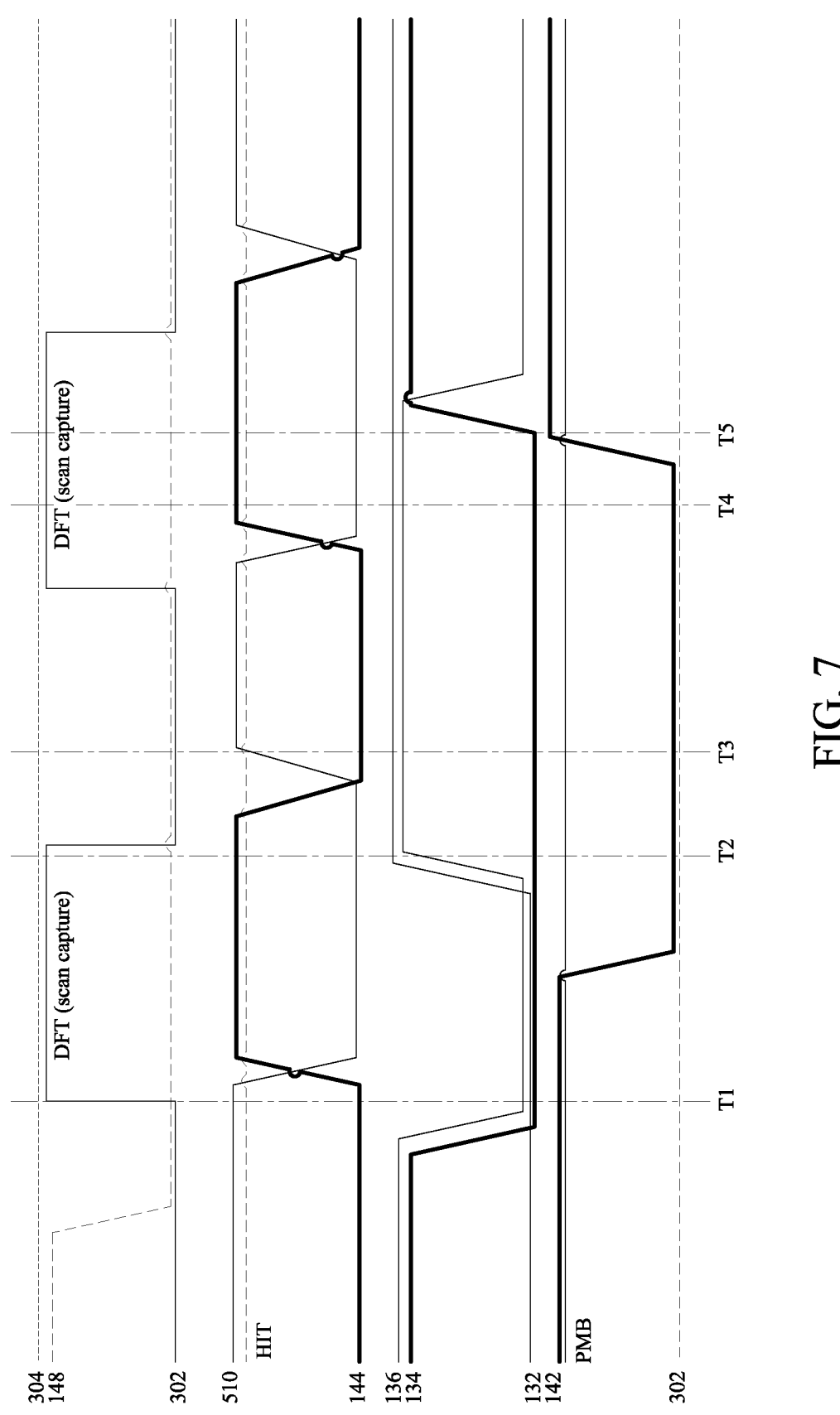
FIG. 7 illustrates waveforms of signals in the memory device in FIG. 6, in accordance with some embodiments of the present disclosure.

FIG. 6 illustrates a detailed schematic diagram of the memory device 100 of FIGS. 1 and 2 in a DFT test mode, in accordance with some embodiments of the present disclosure.

At a DFT test mode, the test enable signal DFTB 148 can be set at "0", which can make the NOR gate 120 output the BWEB signal 134. The XOR gate 103 may receive the data signal D 132 and the BWEB signal 134. In such case, the XOR gate 103 may generate the bypass data signal SXOR 136 (a data signal XOR), and may transmit the bypass data signal SXOR 136 (the data signal XOR) to the first latch 104. When the memory device 100 is at a DFT test mode, the first transistor 108, the first switch 112, and the second switch 114 are activated, and the second transistor 110 (e.g., sense amplifier pull-down transistor N4) is deactivated. The first switch 112 and the second switch 114, each gated by the D-SAE signal and/or the D-SAEB signal, may propagate the data signal XOR and data signal bar XORB into the first latch 104 (sense amplifier).

In the DFT test mode, the signal GLB_DCK 302 and the test enable signal DFTB 148 are set to a low logic state ("0"), while the signal IWEB 304 is set to a high logic state ("1"). The signal GLB_SAE 306 may toggle as a single clock source for a DFT D-flip-flop. The DLEQB signal is set to 1, disabling the pre-chargers of DL. While the D latch circuit 116 (e.g., BWEB latch) may toggle, the write behavior is deactivated. The first latch 104 (sense amplifier) may function as a master latch during a DFT operation. The second latch 106 may function as a shadow latch in a DFT D-flip-flop. The first latch 104 and the second latch 106 collectively operate as a data flip-flop (e.g., D-flip-flop) in the DFT test mode. It may not be necessary to retain the previously read-out data during the DFT test mode.

FIG. 7 illustrates waveforms of signals in the memory device 100 in FIG. 6, in accordance with some embodiments of the present disclosure. The principle of DFT test operation of the memory circuit 100 can be explained by using a timing diagram as shown in FIG. 7. At a DFT test mode, the test enable signal DFTB 148 can be set low ("0"). The write enable signal BWEB 134 changes to the low logic state and accordingly the exclusive OR (XOR) gate 103 generates the bypass data signal XOR 136 having the low logic state when the data signal D 132 has the low logic state.

At time T1, as a global clock signal CLK 302 for the memory device 100 goes high, the NOR gate 120 generates the enable signal D-SAEB 510 having the low logic value in response to the enable signal SAE 144 rising to have the high logic state and the test enable signal DFTB 148 having the low logic. The inverter 242 may invert the enable signal D-SAEB 510 to generate the enable signal D-SAE 144 having the high logic state.

During time T1-T2, the data signal D 132 is inputted and rises to have the high logic state. The exclusive OR gate 103 generates and transmits the bypass data signal XOR 136 having the high logic state at time T2 to the first latch 104 (sense amplifier).

At time T3, in the test mode, the read gating circuit 250 is turned on to transmit the bypass data signal XOR 136 to the latch circuit 252, in response to the enable signal D-SAEB 510 having the high logic state and the enable signal D-SAE 144 having the low logic state, when the second latch 106 (e.g., referred to as a high-pass latch circuit) is turned off in response to the enable signal SAE 144 having the low logic state and the enable signal SAEB 510 having the high logic state. Specifically, the bypass data signal XOR 136 having the high logic state is transmitted to the data line DL 138 through the transmission gate 112 and the bypass data signal XORB 262 having the low logic state is transmitted to the data line DLB 140 through the transmission gate 114. Accordingly, during the test mode, the first latch 104 adjusts voltage levels of the data lines DL 138 and DLB 140 according to the bypass data signal XOR 136, corresponding to the data signal D 132, in response to the enable signal SAE 144 having the low logic state and the enable signal D-SAEB 510 having the high logic state.

At time T4, the high-pass output second latch 106 is turned on in response to the enable signal SAE 144 rising to have the high logic state and the enable signal SAEB 510 having the low logic state. Specifically, the transistor P6 is turned on in response to the data line DLB 140 having a low voltage level corresponding to the bypass data signal XORB 262, and transmits the supply voltage VDDM to the node n1 through the turned-on transistor P7 responsive to the enable signal SAEB 510. Accordingly, the second latch 106 generates a data output signal SQ by the inverter 212 therein, in which the data output signal SQ has the low logic state.

At time T5, the transmission gate 230 transmits the data output signal SQ, in response to the control enable signal HIT having the high logic state and the control enable signal HITB having the low logic state, to the NOR gate 234. The NOR gate 234 generates the output signal Q 142 having the high logic state in response to the enable control signal PM having the low logic state and the data output signal SQ having the low logic state. Accordingly, the output signal Q 142 and the data signal D 132 have the same logic state. Alternatively stated, the data of the data signal D 132 is latched by the first latch 104 and second latch 106, and is transmitted to the output signal Q 142 in the test mode.

With the configurations of the present disclosure, the first latch (sense amplifier) 104, reading out data from memory cells in the read mode, and the second latch (Q latch circuit) 106, latching the read data temporarily for further operations, are configured to scan capture or shoot test data in the test mode, which achieves area and power saving as no extra D flip-flop circuit, shadow latches, and/or other associated logic circuit are necessary to be equipped. Furthermore, based on the reasons above, leakage in the memory device is remedied along with reduced number of circuits and logic gates.

Figure 8:
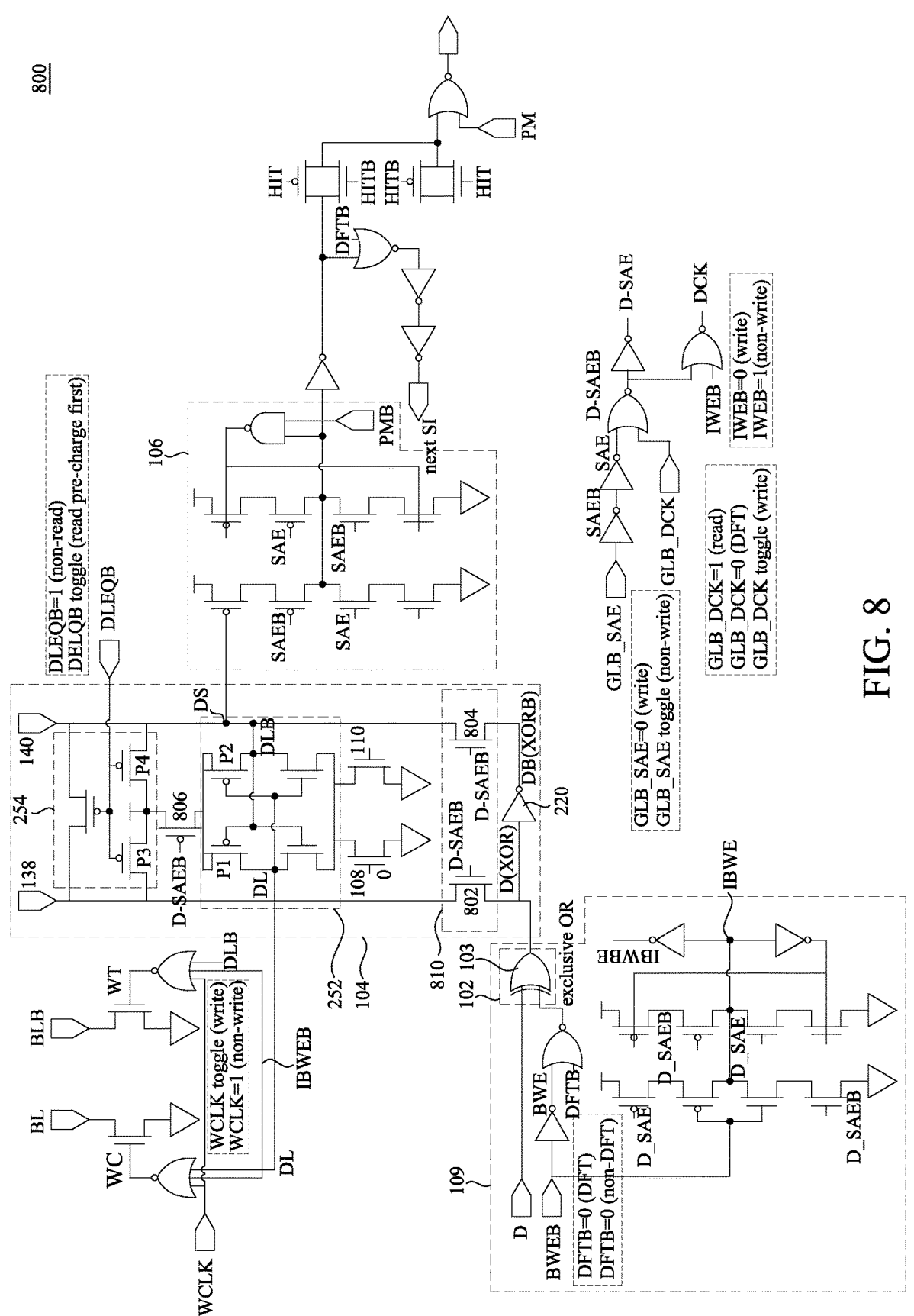
FIG. 8 illustrates a detailed schematic diagram of the memory device of FIG. 1, in accordance with some embodiments of the present disclosure.

FIG. 8 illustrates a detailed schematic diagram of the memory device 100 of FIG. 1, in accordance with some embodiments of the present disclosure. The memory device 800 may include an input circuit 109, a bypass circuit 102, a first latch 104, a second latch 106, a first transistor 108, and a second transistor 110. The memory device 800 of FIG. 8 is substantially similar to the memory device 100 of FIGS. 1 and 2, except that the first switch 802 and the second switch 804 are both replaced by N-type transistors. The specific operations of similar elements, which are already discussed in detail in above paragraphs, are omitted herein for the sake of brevity, unless there is a need to introduce the co-operation relationship with the elements shown in FIG. 8.

Compared with FIG. 2, instead of having the transmission gates 112, 114 to transmit the bypass data signals SXOR and SXORB, the read gating circuit 810 in FIG. 8 includes N-type transistors. For illustration, the transistor 802 is coupled to the data line DL 138 and configured to be turned on in response to the enable signal D-SAEB to transmit the bypass data signal SXOR to the data line DL 138. The transistor 804 is coupled to the data line DLB 140 and configured to be turned on in response to the enable signal D-SAEB to transmit the bypass data signal SXORB to the data line DLB 140. The read gating circuit 810 is coupled between the data lines DL 138 and DLB 140, the bypass circuit 102, and the inverter 220 of the first latch 104.

Furthermore, the first latch 104 includes a P-type transistor 806 coupled between the precharge circuit 254 and the latch circuit 252. Specifically, the transistor 806 has a first terminal coupled between the transistors P3-P4 at the voltage terminal VDDM and a second terminal coupled between the transistors P1-P2.

In operation of the test mode, the transistor 806 is turned off to prevent the data lines DL 138 and DLB 140 being influenced by other signals in the memory device 100. Alternatively stated, the voltage levels of the data lines DL 138 and DLB 140 are modulated merely based on the bypass data signal SXOR and SXORB.

Figure 9:
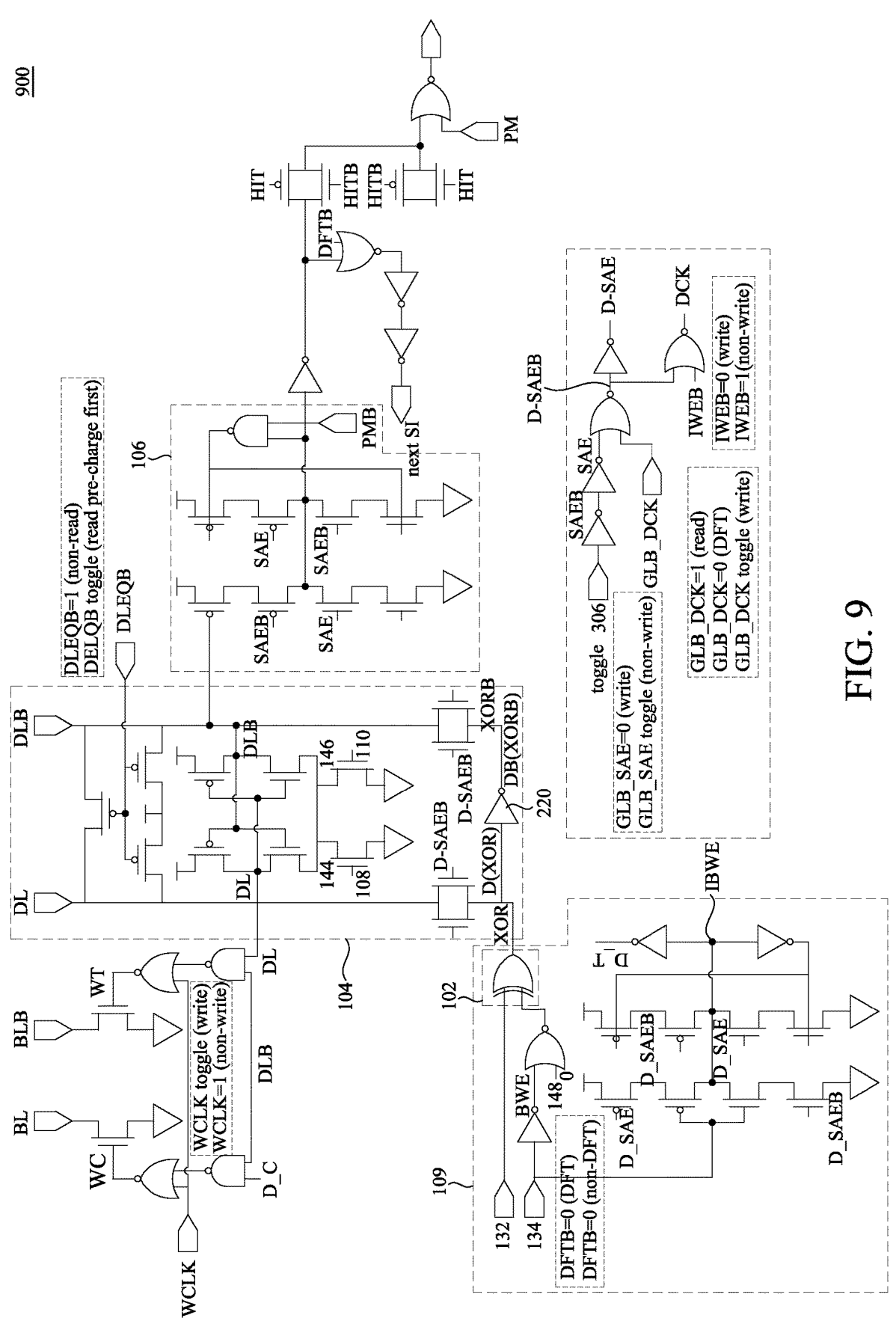
FIG. 9 illustrates a detailed schematic diagram of the memory device of FIG. 1, in accordance with some embodiments of the present disclosure.

FIG. 9 illustrates a detailed schematic diagram of the memory device 100 of FIG. 1, in accordance with some embodiments of the present disclosure. The memory device 900 may include an input circuit 909, a bypass circuit 102, a first latch 104, a second latch 106, a first transistor 108, and a second transistor 110. The memory device 900 of FIG. 9 is substantially similar to the memory device 100 of FIGS. 1 and 2, except that the input circuit 909. The specific operations of similar elements, which are already discussed in detail in above paragraphs, are omitted herein for the sake of brevity, unless there is a need to introduce the co-operation relationship with the elements shown in FIG. 9.

In the memory device 900, the bypass circuit 102 may be configured to directly receive a write enable signal BWEB 134 and indirectly receive a data signal D 132. The operations of the memory device 900 of FIG. 9 is substantially similar to the operations of the memory device 100 of FIGS. 1 and 2. The input circuit 909 can be utilized to eliminate the need for a BWEB latch and a shadow latch related circuits. In the DFT test mode, the first latch 104 and the second latch 106 collectively operate as a data flip-flop (e.g., D-flip-flop) where a clock signal (e.g., the DCK signal 146) is disabled and a sense enable signal (e.g., the SAE signal 144) toggles as a clock source for the data flip-flop.

FIG. 10 is a flowchart of an example method 1000 for operating the memory device 100 of FIGS. 1 and 2, in accordance with some embodiments of the present disclosure. The method 1000 may be used to operate the memory device 100. For example, at least some of the operations described in the method 1000 can be performed during a test mode for a memory device 100. It is noted that the method 1000 is merely an example and is not intended to limit the present disclosure. Accordingly, it is understood that additional operations may be provided before, during, and after the method 1000 of FIG. 10, and that some other operations may only be briefly described herein.

The method 1000 starts with operation 1002 in which a memory circuit 100 may directly receive a data signal 132 and indirectly receive a write enable signal 134 to generate a bypass data signal 136. For example, in FIG. 2, the bypass circuit 102 may directly receive the data signal D 132 and indirectly receive the write enable signal BWEB 134. The bypass circuit 102 may generate an XOR output 136 according to the directly received data signal D 132 and the indirectly received write enable signal BWEB 134.

The method 1000 continues to operation 1004 in which the memory circuit 100 may transmit the bypass data signal 136 to a first latch (master latch) 104. The first latch 104 is coupled to a memory bit cell through a first data line 138 and a second data line 140. Continuing with the above example in FIG. 2, the XOR gate 103 may transmit the bypass data signal SXOR 136 to the first latch 104.

The method 1000 continues to operation 1006 in which the memory circuit 100 may transmit a logic inverse of the bypass data signal 262 to the first latch (master latch) 104. The master latch 104 includes a sense amplifier coupled to a first transistor 108 and a second transistor 110. The first transistor 108 gated by a sense enable signal 144 and the second transistor 110 gated by a clock signal 146. Continuing with the above example in FIG. 2, the inverter 118 of the first latch 104 may generate an inverted bypass data signal XORB 262 according to the bypass data signal SXOR 136 (the data signal XOR). The second switch 114 may transmit the inverted bypass data signal XORB 262 from the inverter 220 to the data line DLB 140. The first transistor 108 can be coupled to the first latch 104 and gated by a sense enable signal SAE 144. The second transistor 110 can be coupled to the first latch 104 and gated by a clock signal DCK 146.

The method 1000 continues to operation 1008 in which the memory circuit 100 may generate a data output signal 142 based on a voltage level presented on the second data line 140 from a second latch (shadow latch) 106. The shadow latch 106 includes a Q latch. The master latch 104 together with the shadow latch 106 operatively serve as a data flip-flop. The operations 1002-1008 are performed during a test mode for a memory circuit 100. Continuing with the above example in FIG. 2, the second latch 106 can be configured to generate an output signal Q 142 based on a voltage level presented on the second data line 140. The first latch 104 may utilize the bypass data signal SXOR 136 (the data signal XOR) and the inverted bypass data signal XORB 262 as inputs to operate as a DFT D-flip-flop.

The present disclosure involves the removal of components such as the write-in latch, shadow latch, 3-to-1 MUX, PM ISO clamping, and power-saving logic from the circuit. The removal results in a significant improvement in layout area utilization within every IO. Furthermore, the elimination of extra devices and transistors for the write-in and shadow latch, along with their related logic schemes, contributes to a notable reduction in leakage. The absence of these additional circuits minimizes power consumption, as there are no extra signal toggling activities. Despite the removal of these components, the read, write, and DFT operations continue to function effectively. The Q-latch retains the last read data even during write mode, ensuring there is no performance impact. The memory design provides promising results in terms of DFT-related racing issues. Additionally, it is anticipated that the layout will benefit from an improved IO area-saving ratio in future implementations. This approach offers improved layout area utilization, reduced leakage, lower power consumption, and maintains the functionality of essential operations without performance degradation.

As used herein, the terms "about" and "approximately" generally mean plus or minus 10% of the stated value. For example, about 0.5 would include 0.45 and 0.55, about 10 would include 9 to 11, about 1000 would include 900 to 1100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An input/output circuit, comprising:
a bypass circuit configured to directly receive a data signal and indirectly receive a write enable signal through an XOR gate, wherein the XOR gate generates a bypass data signal based on the data signal and the write enable signal;
a first latch coupled between a first data line and a second data line, and including a first switch and a second switch, wherein the first switch is coupled between the first data line and an output of the bypass circuit, and wherein the second switch is coupled between the second data line and the output of the bypass circuit;
a second latch operatively coupled to the first latch and configured to generate a data output signal based on a voltage level presented on the second data line;
a first transistor coupled to the first latch and gated by a sense enable signal; and
a second transistor coupled to the first latch and gated by a clock signal;
wherein the first transistor and the second transistor are alternately activated in each of a plurality of operation modes of the input/output circuit.

2. The input/output circuit of claim 1, wherein the first latch and the second latch collectively operate as a data flip-flop in at least one of the plurality of operation modes where the clock signal is disabled and the sense enable signal toggles as a clock source for the data flip-flop.

3. The input/output circuit of claim 1, wherein the XOR gate receives the write enable signal at least through an inverter and a NOR gate, and the NOR gate has one of its inputs configured to receive a control signal, and wherein when the control signal is at a first logic state, the input/output circuit is configured at a non-test mode, and when the control signal is at a second logic state, the input/output circuit is configured at a test mode.

4. The input/output circuit of claim 1, wherein the first and second switches each include a transmission gate.

5. The input/output circuit of claim 1, wherein the plurality of operation modes of the input/output circuit include a normal mode, a write mode, and a test mode.

6. The input/output circuit of claim 1, wherein, when the input/output circuit is at a read mode, the second transistor, the first switch, and the second switch are deactivated, and the first transistor is activated.

7. The input/output circuit of claim 1, wherein, when the input/output circuit is at a write mode, the first transistor is deactivated, and the second transistor, the first switch, and the second switch are activated.

8. The input/output circuit of claim 1, wherein, when the input/output circuit is at a test mode, the first transistor, the first switch, and the second switch are activated, and the second transistor is deactivated.

9. The input/output circuit of claim 1, wherein the first latch is coupled to a memory array through the first data line and the second data line.

10. A memory circuit, comprising:
a memory array including a memory bit cell coupled between a first data line and a second data line; and
an input/output circuit operatively coupled to the memory array and including:
a bypass circuit configured to directly receive a data signal and indirectly receive a write enable signal through an XOR gate, wherein the XOR gate generates a bypass data signal based on the data signal and the write enable signal;
a first latch coupled to the first data line and the second data line, and including a first switch and a second switch, wherein the first switch is configured to selectively couple the bypass data signal to the first date line and the second switch is configured to selectively couple an inverse of the bypass data signal to the second data line; and
a second latch operatively coupled to the first latch and configured to generate a data output signal based on a voltage level presented on the second data line.

11. The memory circuit of claim 10, wherein the input/output circuit further includes:
a first transistor coupled to the first latch and gated by a sense enable signal; and
a second transistor coupled to the first latch and gated by a clock signal;
wherein the first transistor and the second transistor are alternately activated in each of a plurality of operation modes of the input/output circuit.

12. The memory circuit of claim 11, wherein the first latch and the second latch collectively operate as a data flip-flop when the input/output circuit is configured at a Design-For-Testability (DFT) mode for the memory array, where the clock signal is disabled and the sense enable signal toggles as a clock source for the data flip-flop.

13. The memory circuit of claim 10, wherein the first and second switches each include a transmission gate.

14. The memory circuit of claim 10, wherein the first and second switches each include a transistor.

15. The memory circuit of claim 10, wherein the bypass circuit includes the XOR gate having one of its inputs configured to receive the write enable signal at least through an inverter and a NOR gate.

16. The memory circuit of claim 15, wherein the NOR gate has one of its inputs configured to receive a control signal, and wherein when the control signal is at a first logic state, the input/output circuit is configured at a non-test mode, and when the control signal is at a second logic state, the input/output circuit is configured at a test mode.

17. A method for operating a memory circuit, comprising:

directly receiving a data signal and indirectly receiving a write enable signal through an XOR gate, wherein the XOR gate generates a bypass data signal based on the data signal and the write enable signal;

transmitting, to a master latch, the bypass data signal, wherein the master latch is coupled to a memory bit cell through a first data line and a second data line;

transmitting, to the master latch, a logic inverse of the bypass data signal; and generating, from a shadow latch, a data output signal based on a voltage level presented on the second data line.

18. The method of claim 17, wherein the steps of directly receiving a data signal and indirectly receiving a write enable signal to generate a bypass data signal, transmitting, to a master latch, the bypass data signal, transmitting, to the master latch, a logic inverse of the bypass data signal, and generating, from a shadow latch, a data output signal based on a voltage level presented on the second data line are performed during a test mode for a memory circuit.

19. The method of claim 17, wherein the master latch includes a sense amplifier coupled to a first transistor and a second transistor, and the shadow latch includes a Q latch, the first transistor gated by a sense enable signal and the second transistor gated by a clock signal, and wherein the master latch together with the shadow latch operatively serve as a data flip-flop.

20. The method of claim 17, wherein the XOR gate receives the write enable signal at least through an inverter and a NOR gate.

* * * * *